United States Patent [19]
Epstein et al.

[11] Patent Number: 5,821,453
[45] Date of Patent: *Oct. 13, 1998

[54] MOLECULAR BASED MAGNETS COMPRISING VANADIUM TETRACYANOETHYLENE COMPLEXES FOR SHIELDING ELECTROMAGNETIC FIELDS

[75] Inventors: Arthur J. Epstein; Brian G. Morin, both of Columbus, Ohio

[73] Assignee: The Ohio State University Research Foundation, Columbus, Ohio

[ * ] Notice: This patent issued on a continued prosecution application filed under 37 CFR 1.53(d), and is subject to the twenty year patent term provisions of 35 U.S.C. 154(a)(2).

[21] Appl. No.: 151,413

[22] Filed: Nov. 12, 1993

[51] Int. Cl.$^6$ ......................................................... H05K 9/00
[52] U.S. Cl. ..................................... 174/35 MS; 174/35 R
[58] Field of Search ................................. 428/411.1, 426, 428/457, 320.2, 928; 29/592.1; 174/35 MS, 35 R; 585/24; 361/800, 816–818; 556/42–44; 502/104, 113

[56] References Cited

PUBLICATIONS

Epstein et al., "Magnetic Phenomena in V(TCNE)x.y(Solvent): Role of Disorder and Random Anisotropy," Mol. Cryst. Liq. Cryst., vol. 23, pp. 171–190, 1993.
Miller et al., "New Magnetic–Ordered Materials with High Tc," Mol. Cryst. Liq. Cryst., vol. 233, pp. 133–152, 1993.
Miller et al., "New High–Tc Molecular Based Magnets," Synthetic Metals, 55–57, pp. 3291–3298, 1993.
Zipse, "Health Effects of Extremely Low–Frequency (50– and 60–Hz) Electric and Magnetic Fields", *IEEE Transactions on Industry Applications*, vol. 29, No. 2, Mar./Apr. 1993, pp. 447–458.
Amato, "Some Molecular Magnets Like It Hot", *Research News*, Jun. 1991, p. 1379.
Du et al., "Anomalous Charge Transport Phenomena In Molecular–Based Magnet V(TCNE)$_x$:y(solvent)", *J. Appl. Phys.*, vol. 73, No. 10, May 15, 1993, pp. 6566–6568.
Manriquez et al., "A Room–Temperature Molecular/Organic–Based Magnet", *Science*, vol. 252, Jun. 7, 1991, pp. 1415–1417.
Morin et al., "Complex AC Susceptibility Studies of the Disordered Molecular Based Magnets V(TCNE)$_x$: Role of Spinless Solvent", *J. Appl. Phys.*, vol. 73, No. 10, May 15, 1993, pp. 5648–5650.
Zhou et al., "Magnetization and static scaling of the high–Tc disordered molecular–based magnet V(tetracyanoethylene)$_x$·y(Ch$_3$CN) with x 1.5 and y 2", *Physical Review B*, vol. 48, No. 2, Jul. 1993–II, pp. 1325–1328.
Major, "Shields, Magnetic", *Sensors and Devices, Magnetic*, 1992, pp. 492–493.
Glanz, "Worry Over Power Lines Likely to Last", *R&D Magazine*, Apr. 1993, p. 73.
Fitzgerald et al., "Electromagnetic Fields: the jury's still out", *IEEE Spectrum*, Aug. 1990, pp. 22–35.
Kirkpatrick, "Do Cellular Phones Cause Cancer?", *Fortune*, Mar. 8, 1993, pp. 82–89.

*Primary Examiner*—Bot L. Ledynh
*Attorney, Agent, or Firm*—Frank H. Foster; Kremblas, Foster, Millard & Pollick

[57] ABSTRACT

The invention presents a vanadium tetracyanoethylene solvent complex for electromagnetic field shielding, and a method for blocking low frequency and magnetic fields using these vanadium tetracyanoethylene compositions. The compositions of the invention can be produced at ambient temperature and are light weight, low density and flexible. The materials of the present invention are useful as magnetic shields to block low frequency fields and static fields, and for use in cores in transformers and motors.

13 Claims, 10 Drawing Sheets

| Material | $B_s$ (G) | $B_r$ (G) | $H_c$ (Oe) | $\mu_i$ | $\mu_i/\rho_d$ | $\rho_r$ (Ω cm) | W (erg/cm³) | $\rho_d$ (g/cm³) |
|---|---|---|---|---|---|---|---|---|
| Fe (99.8%) | 20,500 | 8,600 | 1.4 | 10 | 1.3 | $3 \times 10^{-5}$ | 30,000 | 7.9 |
| Fe (99.9%) | 21,500 | - | 1.0 | 200 | 25 | $1 \times 10^{-5}$ | 5,000 | 7.9 |
| Fe (99.95%) | 21,500 | - | 0.05 | 10,000 | 1,300 | $1 \times 10^{-5}$ | 5,000 | 7.9 |
| Mumetal | 6,500 | 3,000 | 0.05 | 20,000 | 2,300 | $6 \times 10^{-5}$ | 300 | 8.7 |
| MF Ferrite | 4,000 | 1,500-2,000 | 0.05-1.2 | 500-1,000 | 100-200 | $3.3 \times 10^6$ | 250 | 5 |
| LF Ferrite | 3,500-5,000 | 800-1,400 | .12-.38 | 800-2,500 | 160-500 | 50-700 | 45-130 | 5 |
| V(TCNE)$_x$ • y(CH$_2$Cl$_2$) | 140 (320$^a$) | 10 | 20-60 | 2 (14$^b$) | 2 | $1 \times 10^4$ | 5,000 | 1.0 |
| V(TCNE)$_x$ • y(C$_4$H$_8$O) | 210$^a$ | - | - | 10$^c$ | ~10$^c$ | - | - | ~1 |
| V(TCNE)$_x$ • y(CH$_3$CN/C$_6$H$_6$) | 180$^a$ | - | - | 15$^d$ | ~15$^d$ | $1 \times 10^5$ | - | ~1 |
| V(TCNE)$_x$ • y(CH$_3$CN) | 190$^a$ | 0.3$^c$ | 0.15$^c$ | 20$^e$ | 20$^e$ | - | 2$^c$ | 1.0 |
| V(TCNE)$_x$ • y(CH$_2$Cl$_2$), V(CO)$_6$ | 315$^a$ | 19$^f$ | 1$^f$ | 12 | 12 | - | 13$^f$ | ~1 |

MOLECULAR BASED MAGNETS COMPRISING VANADIUM TETRACYANOETHYLENE COMPLEXES FOR SHIELDING ELECTROMAGNETIC FIELDS

This invention was made with government support under Department of Energy Division of Material Sciences Grant Number DE-FG-02-86BR456271. The government has certain rights in the invention.

TECHNICAL FIELD

Molecular-based magnets are presented for use as static and low frequency magnetic shielding applications. The invention relates to the use of vanadium-organic complexes for the blocking or shielding of electromagnetic fields and static magnetic fields, and for cores for inductors, transformers, motors, and the like.

BACKGROUND ART

Soft magnets based on molecular and organic polymer complexes present opportunities for developing a new class of light weight materials for magnetic shielding applications and for inductors, transformers, motors and the like that are processible at low temperatures using conventional organic chemistry. By "soft magnet" herein is meant materials which have modest or no permanent magnetic moment but which can divert, block or absorb a static or time varying magnetic field to thereby shield another object from the effects of the magnetic field or electromagnetic fields. The magnetic response of a soft magnet can be tuned over a wide range by the introduction of various dopants and additives.

Ferromagnetism at low temperatures in certain linear chain electron transfer salts has been known since the mid-1980's. Miller and co-workers, including one of the present inventors, reported in 1991 the room temperature ferrimagnetism in the 3-D electron transfer polymeric material $V(TCNE)_x(CH_2Cl_2)_y$ where x is approximately 2 and y is approximately 0.5, V is vanadium and TCNE is tetracyanoethylene.

Magnetic shielding of static and low frequency magnetic fields can be accomplished with soft magnetic materials such as certain molecular complexes. Similarly, the production of cores for inductors, transformers, motors, and the like may be accomplished with soft magnetic materials, such as certain molecular complexes. High initial permeability, (mu) hereinafter $u_i$, and a low coercive field, $H_c$, are desired for these applications. Conventional soft magnetic materials suitable for magnetic shielding and core applications include transition metal alloys and ferrite ceramics.

Metal alloys and ferrite ceramics, however, can be difficult to prepare or work with, can require high temperatures in their preparation, and can exhibit undesirably high weights in some embodiments or applications. Therefore, it would be desirable to have a light weight, molecular-based magnet which is easily prepared, has acceptable permeability and low coercive field, and is processible for use in static and dynamic magnetic shielding applications, and for cores, inductors, transformers, and the like.

BRIEF DISCLOSURE OF INVENTION

The invention relates to an electromagnetic field shield comprising a vanadium tetracyanoethylene solvent complex. More specifically, the present invention is directed to $V(TCNE)_x(solvent)_y$ materials for use as shields for static and low frequency magnetic shielding and core applications. The materials of the present invention exhibit desirable low mass densities, low power loss, and flexible room temperature processibility.

BRIEF DESCRIPTION OF FIGURES

In describing the preferred embodiment of the invention which is illustrated in the Figures, specific terminology will be resorted to for the sake of clarity. However, it is not intended that the invention be limited to the specific terms so selected and it is to be understood that each specific term includes all technical equivalents which operate in a similar manner to accomplish a similar purpose.

FIG. 2(*a*), 2(*b*), 2(*c*), and 2(*d*) show the half hysteresis loops of $V(TCNE)_x(CH_3CN)_y$ at 50 K and at 100 K. Note that units on the x and y axes vary.

DETAILED DESCRIPTION

Thus in one embodiment the present invention is directed to a static and dynamic magnetic shield comprising a vanadium tetracyanoethylene solvent complex.

In another embodiment, the present invention provides an electromagnetic field shield comprising a vanadium tetracyanoethylene solvent complex.

In still another embodiment, the present invention relates to a method of shielding an object from a static or time varying magnetic field, said method comprising applying to an object a composition selected from the group consisting of V(tetracyanoethylene)$_x$(solvent)$_y$, wherein the solvent is selected from the group consisting of 1,2-dichloroethane, benzene, diethyl ether, toluene, dichloromethane, acetonitrile, tetrahydrofuran, and mixtures thereof, and wherein x=1.0 to 2.5 and y varies from 0 to 2.0, whereby the object is shielded or substantially shielded from a magnetic field. The magnetic field thus shielded can be low frequency field, such as dc to $6 \times 10^9$ Hz, however a preferred range is dc to $10^5$ Hz.

In yet another embodiment of the present invention is presented a method of blocking static or time varying electromagnetic field, said method comprising irradiating with an electromagnetic field a composition selected from the group consisting of V(tetracyanoethylene)$_x$(solvent)$_y$, wherein the solvent is selected from the group consisting of 1,2-dichloroethane, benzene, diethyl ether, toluene, dichloromethane, acetonitrile, tetrahydrofuran, and mixtures thereof, and wherein x=1.0 to 2.5 and y varies from 0 to 2.0, whereby the field is blocked or substantially blocked by or cannot pass through the composition.

The invention also is directed to the use of V(TCNE) solvent complexes for inductive applications, including but not limited to cores for transformers, motors, and the like.

Figure 1:
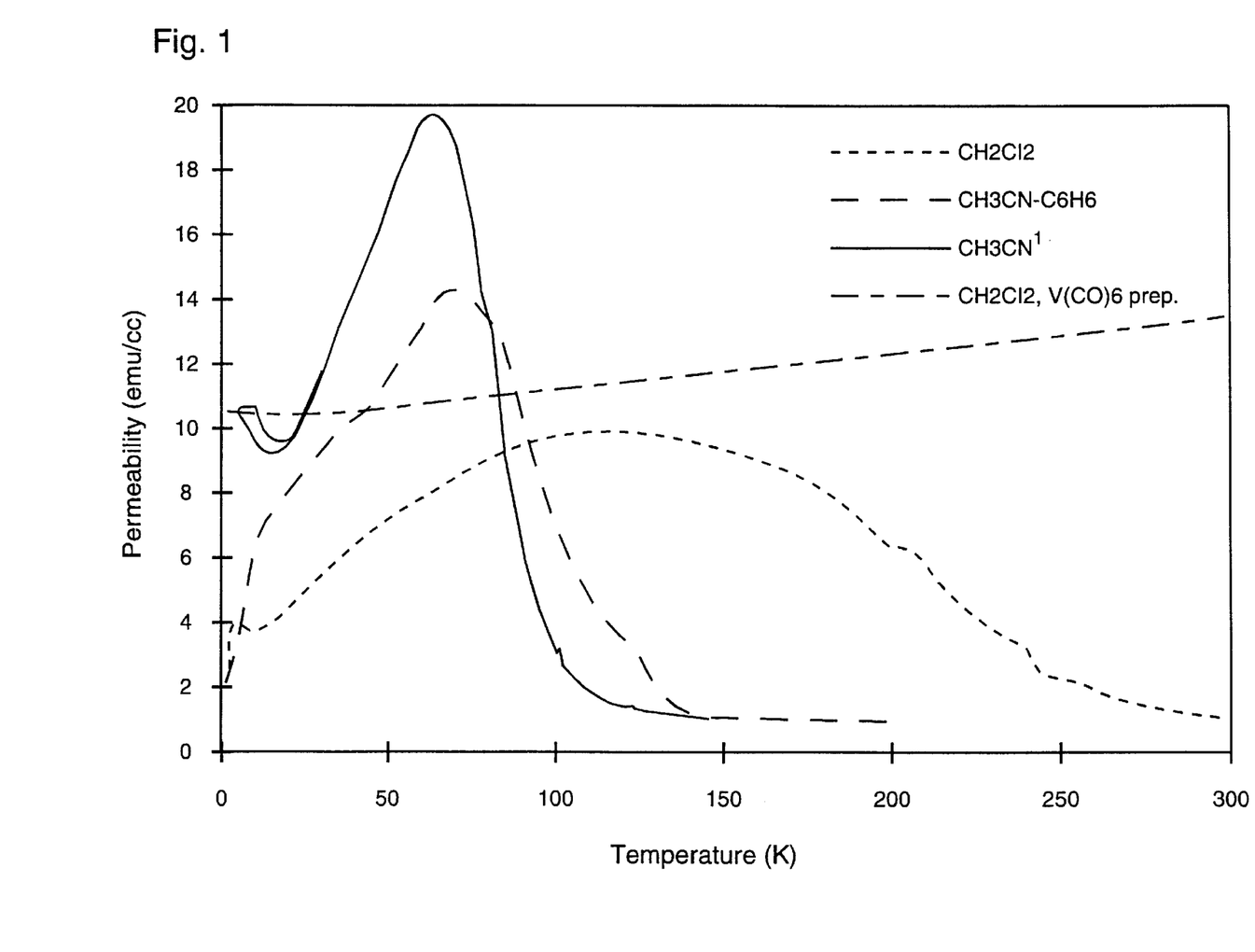
FIG. 1 shows permeability values of $V(TCNE)_x(CH_2C_2)_y$, $V(TCNE)_x(CH_3CN/C_6H_6)_y$, and $V(TCNE)_x(CH_3CN)_y$ derived from $V(C_6H_6)_2$ and $V(TCNE)_x(CH_2Cl_2)_y$ derived from $V(CO)_6$ from 4.2 to 300 K.
Figure 2A:
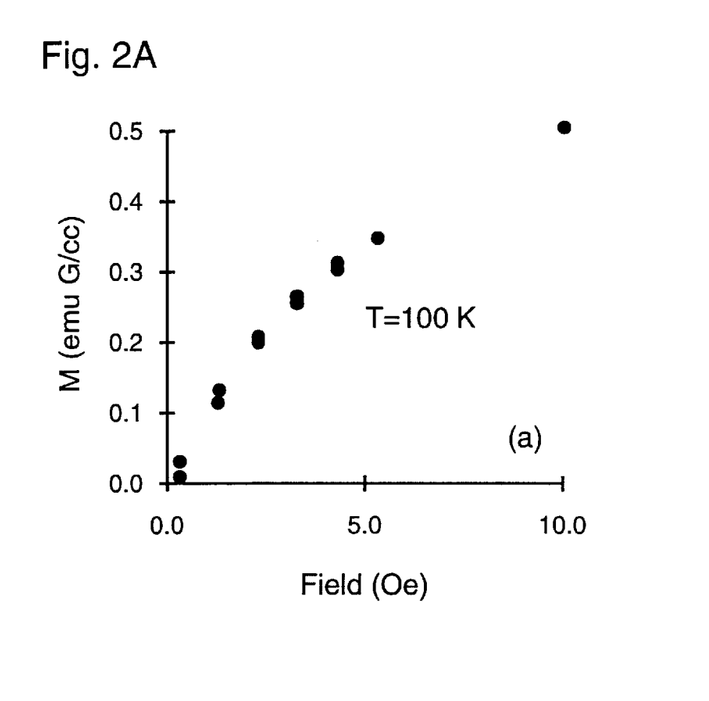
Figure 2B:
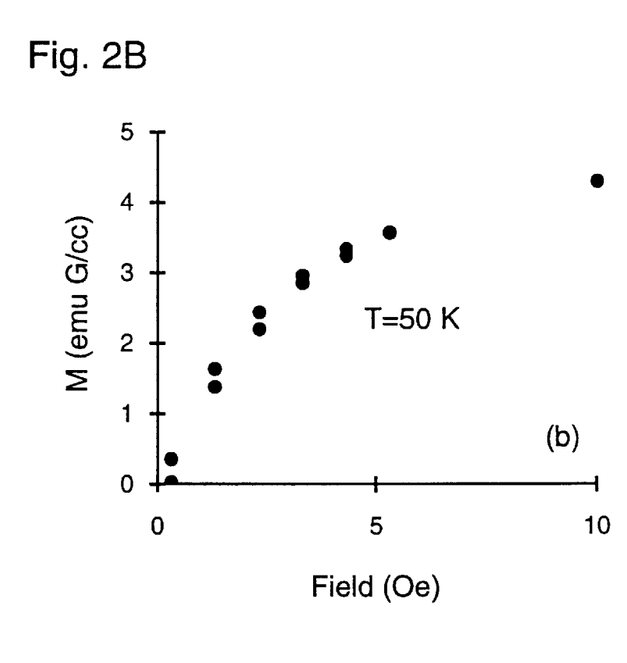
Figure 2C:
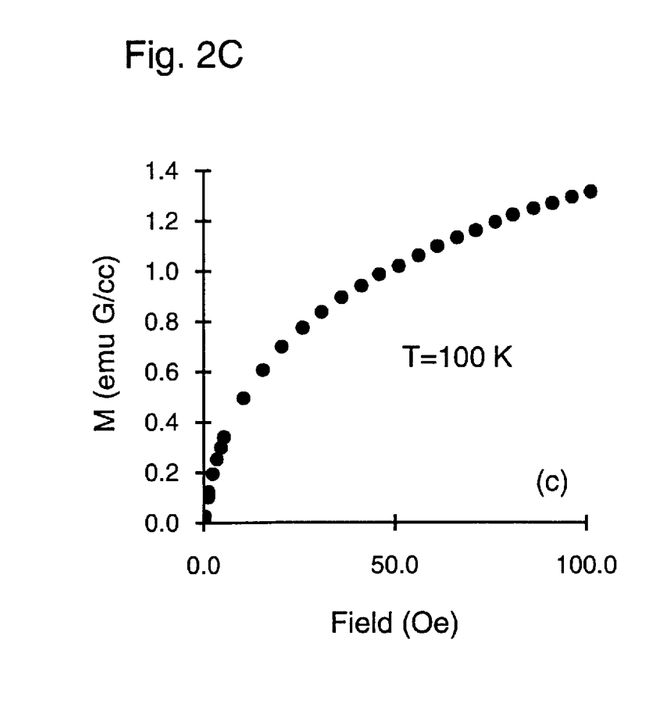
Figure 2D:
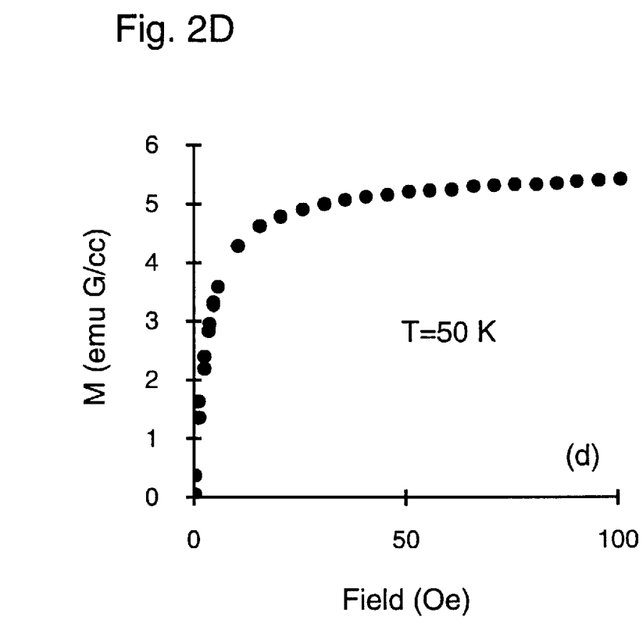

FIG. 1 shows permeability values of V(TCNE)$_x$(CH$_2$Cl$_2$)$_y$, V(TCNE)$_x$(CH$_3$CN/C$_6$H$_6$)$_y$, and V(TCNE)$_x$(CH$_3$CN)$_y$. Also shown is a curve illustrating permeability of the V/TCNE complex derived from V(CO)$_6$ which extends to room temperature with increasing permeability. This is a significant and desirable feature for use as magnetic field and electromagnetic field shielding material.

FIG. 2 shows the half hysteresis loops of V(TCNE)$_x$(CH$_3$CN)$_y$ at 50 K (curves a and c) and at 100 K (curves b and d). In the hysteresis loops, a more vertical slope at the junction of the axes is desired. FIG. 2 should be compared to FIG. 5 which illustrates the hysteresis loop for the V/TCNE complex derived from V(CO)$_6$.

Figure 3:
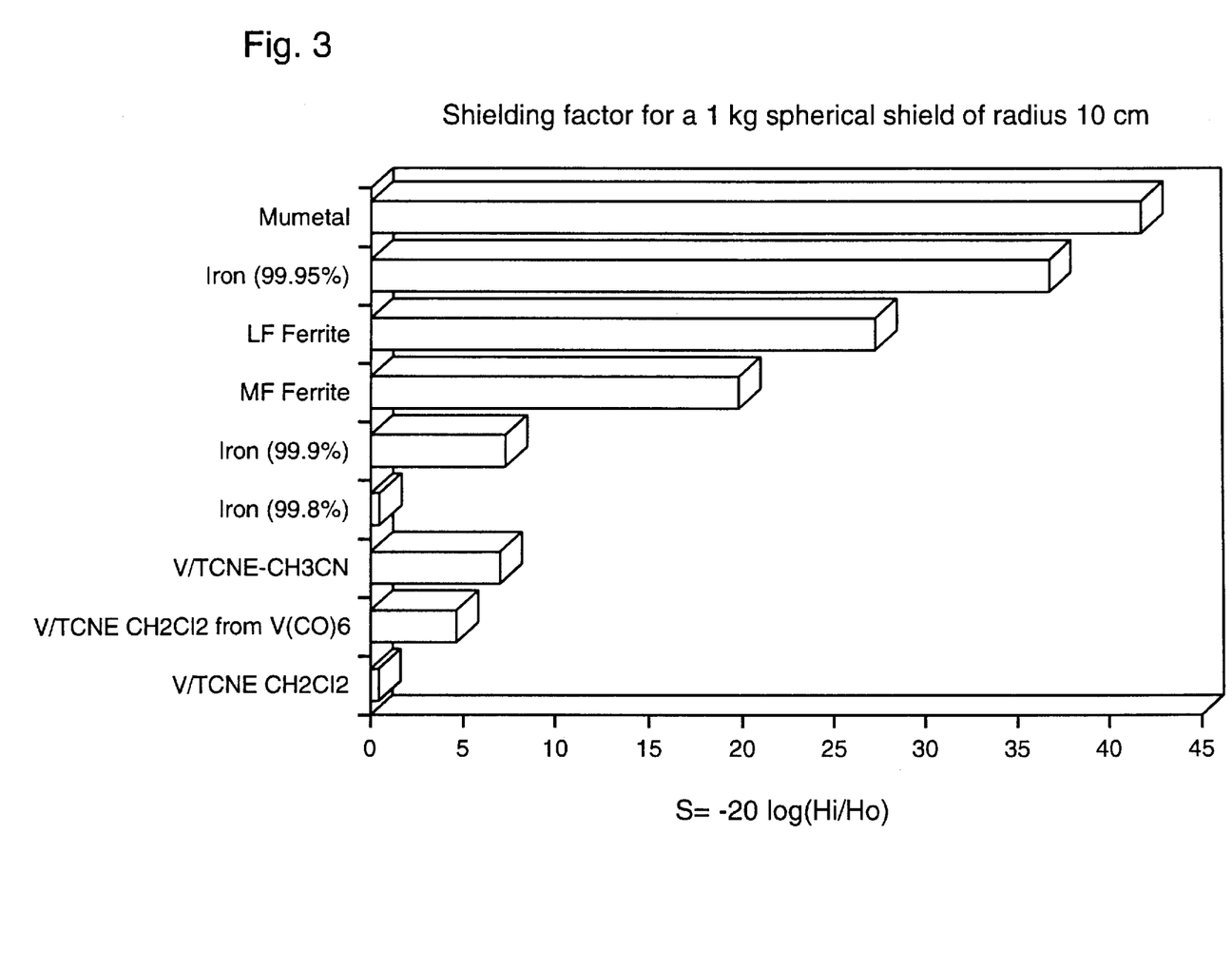
FIG. 3 shows magnetic shielding factors of various materials calulated for a 1 kg spherical shield with a 10 cm radius using the permeability value given in FIG. 4.

FIG. 3 shows magnetic shielding factors of various materials calculated for a 1 kg spherical shield with a 10 cm radius. The values for ferrites, Fe (99.95%) and mumetal are for materials that have undergone detailed annealing and purification processes to thereby obtain high permeability. At least one value for shielding factor of a vanadium TCNE complex of the present invention is shown in FIG. 3 which exceeds the value for iron (99.8%) and other V(TCNE) examples with high shielding values have been demonstrated. FIG. 3 presents the calculated static magnetic shielding factor, defined as S=−20 log(H$_i$/H$_o$), where H$_o$ is an applied static uniform magnetic field and H$_i$ is the static magnetic field inside the sphere of the shield. The V(TCNE) materials of FIG. 3 are room temperature processible while the mumetal, iron (99.95%), LF and MF ferrite are not.

Figure 4:
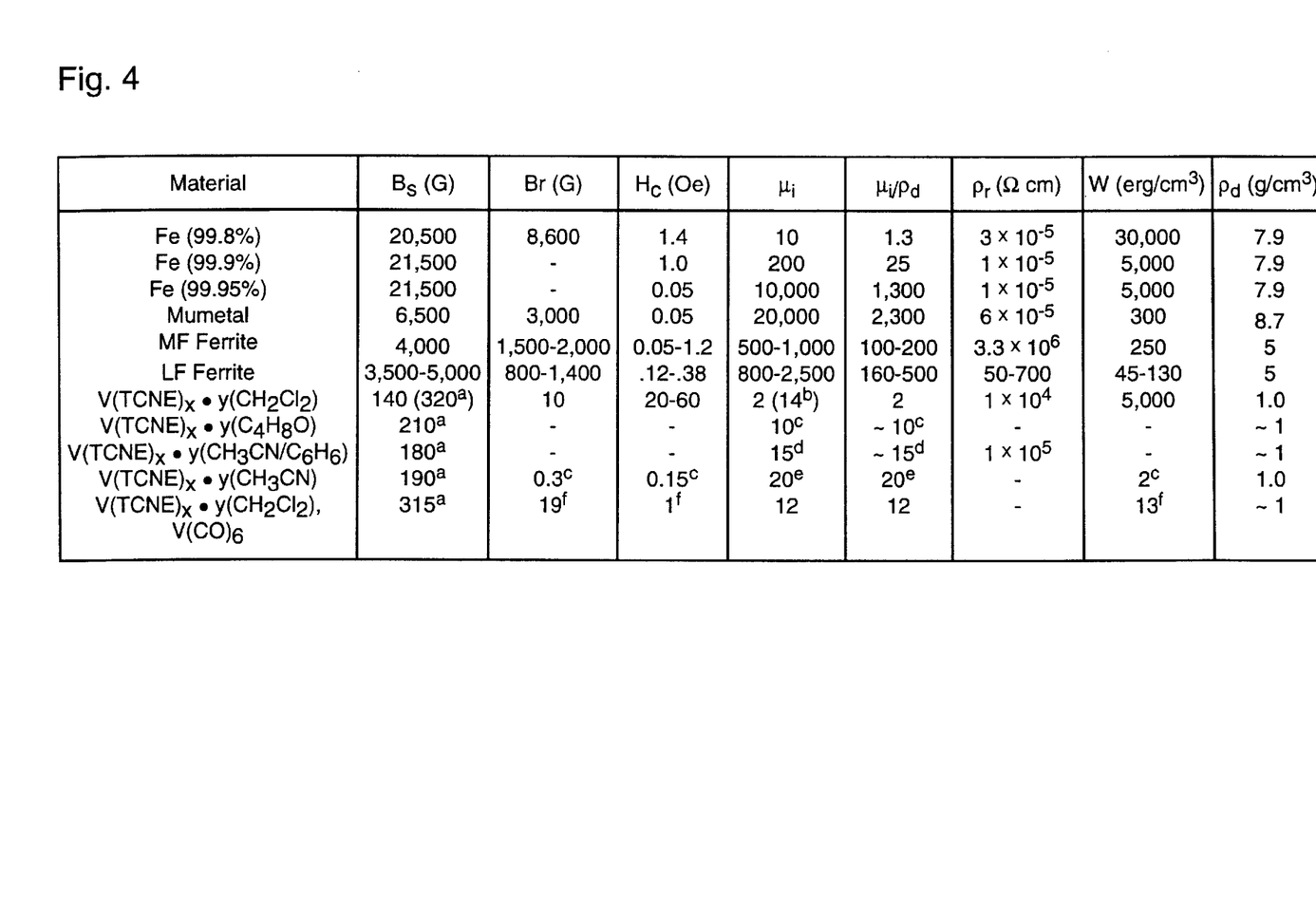
FIG. 4 shows calculated magnetic shielding factors of various materials.

FIG. 4 shows magnetic materials properties for shielding applications for six prior art iron and ferrite materials and five V(TCNE) materials. The measurements were taken at room temperature, except where a footnote reference appears, wherein a=20 K, b=120 K, c=50 K, d=75 K, e=60 K, and f=250 K. Saturation induction for V-TCNE complexes were taken as the induction value measured at 100 G field, which represents induction outside of the hysteresis loop. MF and LF ferrites are MnZnFe ferrites for medium frequency (MF, 0.1–2.0 MHz) and low frequency (LF, <0.2 MHz) applications. The values can be derived from the hysteresis loop, a plot of magnetic induction, B, versus the magnetizing force, H. A good shielding or core material will have large permeability, u, which can be approximated as the slope of the upwardly curved portion of the hysteresis loop, large B$_s$, which is the level of maximum induction, small H$_c$, which is the measure of the magnetizing force, and a small magnetic loss (proportional to the area inside the hysteresis loop). The parameters u and H$_c$, in soft magnetic materials are determined by the ease of the material to be magnetized on the influence of a small magnetic field H. Another important feature of FIG. 4 is the permeability/mass density ratio (mu/rho, hereinafter u/p$_d$). In this aspect, molecular magnetic materials can essentially match transition metal alloys and ferrites. Transition metal alloys offer high initial permeabilities (u$_i$) and high saturation induction (B$_s$), at the cost of having large mass densities (P$_d$), large hysteresis losses (W) and large eddy current losses caused by low resistivities (P$_r$) In terms of room temperature processibility, however, the vanadium TCNE molecular magnetic materials are superior. The density of the molecular based shielding materials is much lower, with a density of about 1.0±0.2 to about 1.5 g/cm$^3$ compared to 5–6 g/cm$^3$ for ferrites and 8–9 g/cm$^3$ for transition metal alloys. Therefore, the density of the V(TCNE) materials can range from 0.8 to 1.7 g/cm$^3$.

Figure 5:
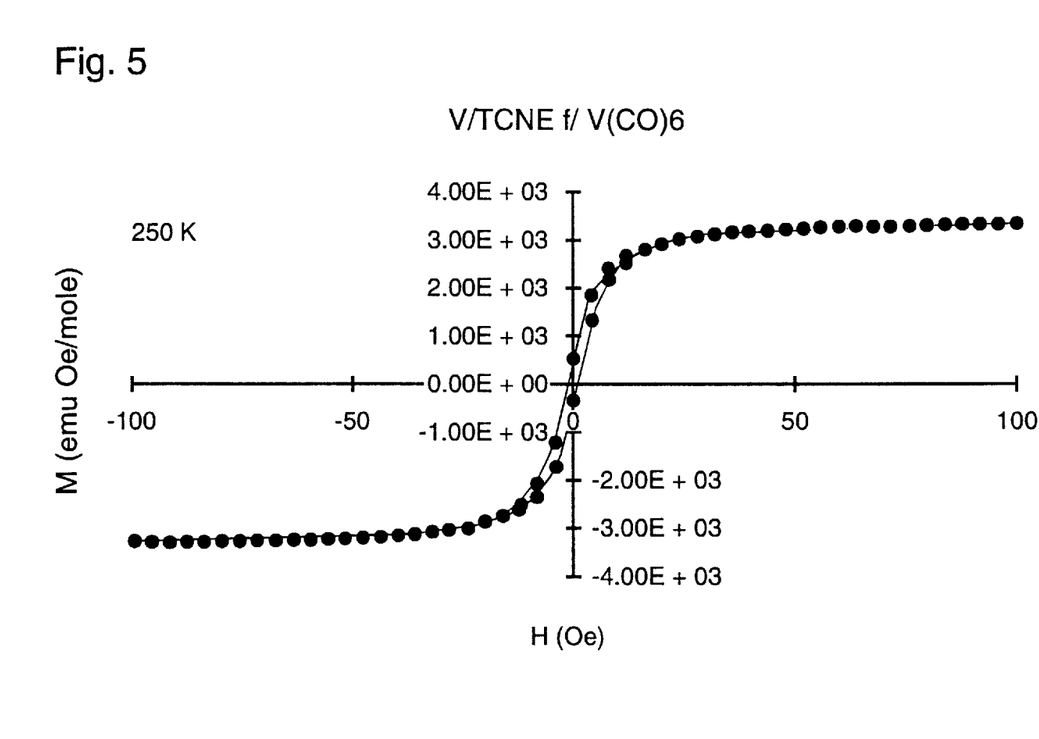
FIG. 5 illustrates the hysteresis loop for the V/TCNE complex derived from $V(CO)_6$.

FIG. 5 illustrates the hysteresis loop for the V/TCNE complex derived from V(CO)$_6$. The measurement was performed at 250 K and indicates a desirable high permeability and low heating as evidenced by the steep slope of the graph through the origin.

Figure 6:
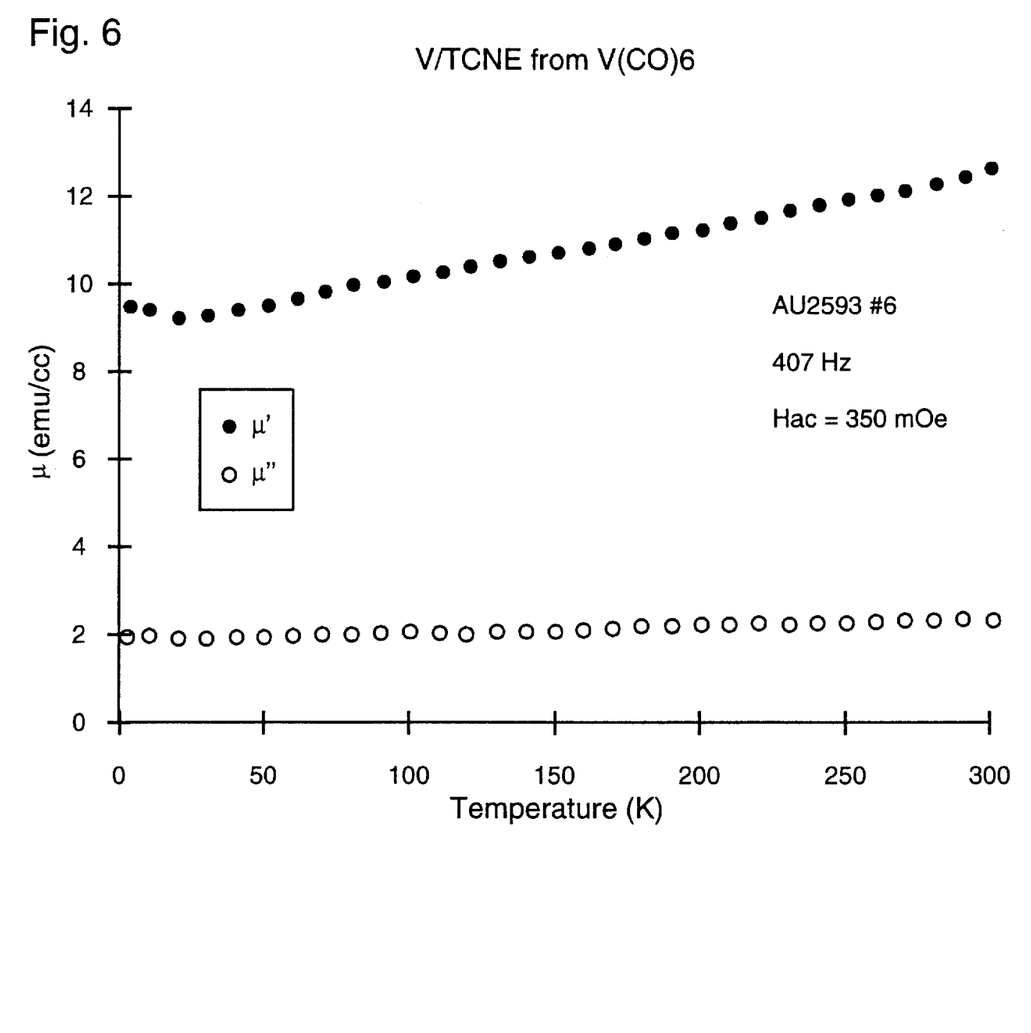
FIG. 6 illustrates permeability, (mu) u, of the V/TCNE complex derived from $V(CO)_6$ over the temperature range from 4.2 K to 300 K.
Figure 7:
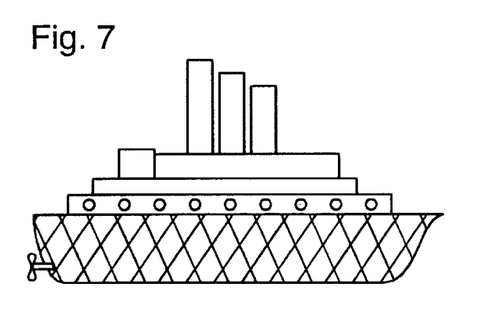
FIG. 7 illustrates a ship's hull which has been at least partially coated with a vanadium tetracyanoethylene solvent complex.
Figure 8:
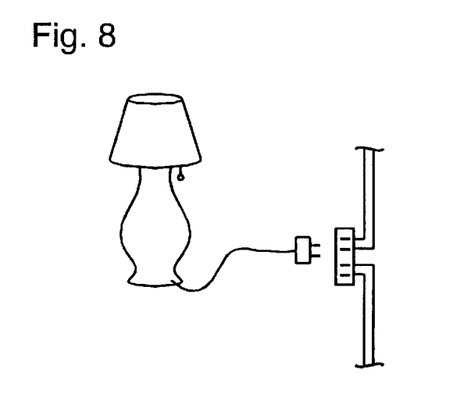
FIG. 8 illustrates a household wiring coated with a vanadium tetracyanoethylene solvent complex.
Figure 9:
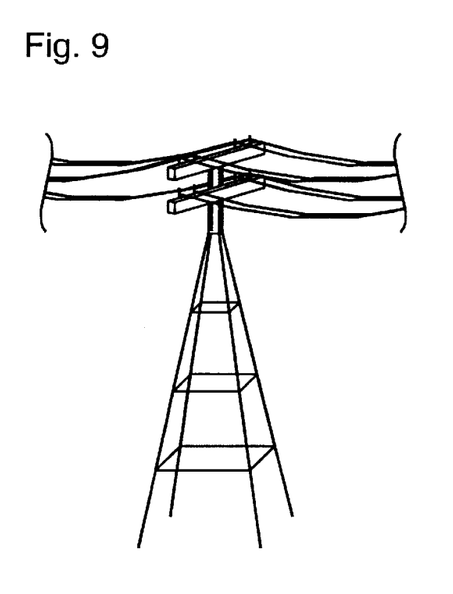
FIG. 9 illustrates a high tension wiring coated with a vanadium tetracyanoethylene solvent complex.
Figure 10:
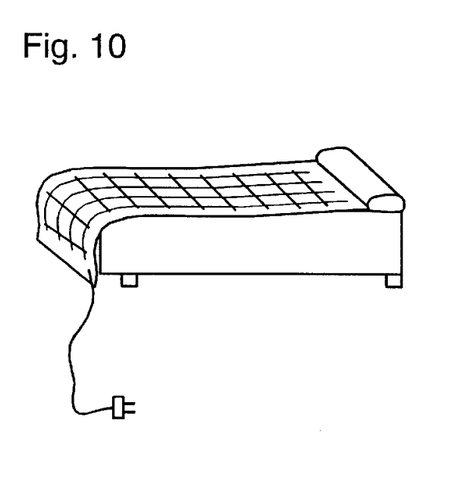
FIG. 10 illustrates an electric blanket whose wiring is coated with a vanadium tetracyanoethylene solvent complex.
Figure 11:
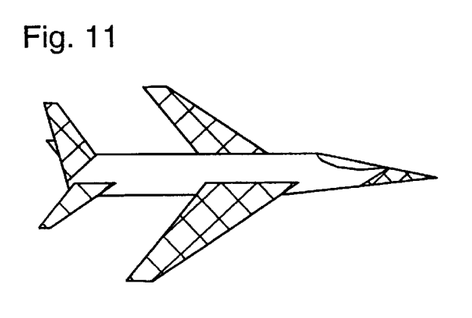
FIG. 11 illustrates an airplane which has been at least partially coated with a vanadium tetracyanoethylene solvent complex.
Figure 12:
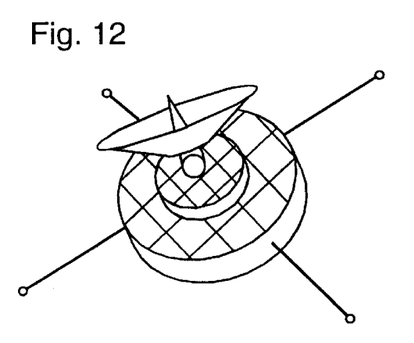
FIG. 12 illustrates a satellite coated with a vanadium tetracyanoethylene solvent complex.
Figure 13:
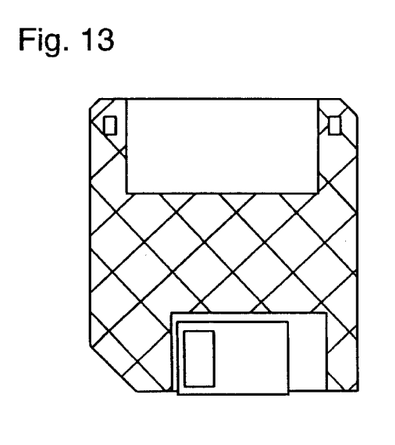
FIG. 13 illustrates a computer disk coated with a vanadium tetracyanoethylene solvent complex.
Figure 14:
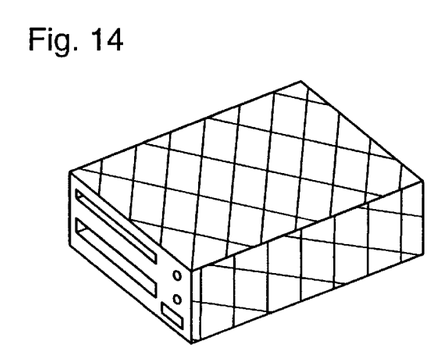
FIG. 14 illustrates a computer disk drive which has been at least partially coated with a vanadium tetracyanoethylene solvent complex.
Figure 15:
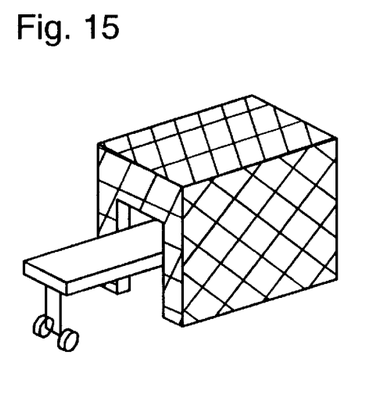
FIG. 15 illustrates a magnetic resonance imaging device which has been at least partially coated with a vanadium tetracyanoethylene solvent complex.
Figure 16:
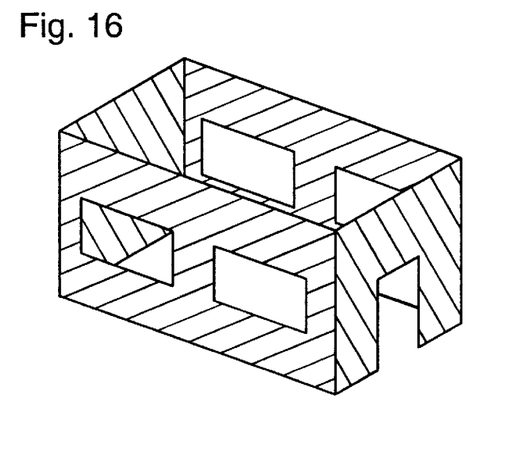
FIG. 16 illustrates a room, the walls of which have been coated with a vanadium tetracyanoethylene solvent complex.
Figure 17:
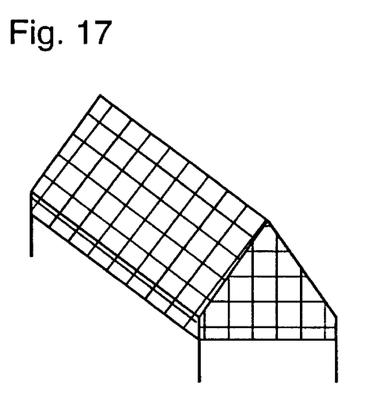
FIG. 17 illustrates a fabric, web, net or tenting which has been treated with a vanadium tetracyanoethylene solvent complex.
Figure 18:
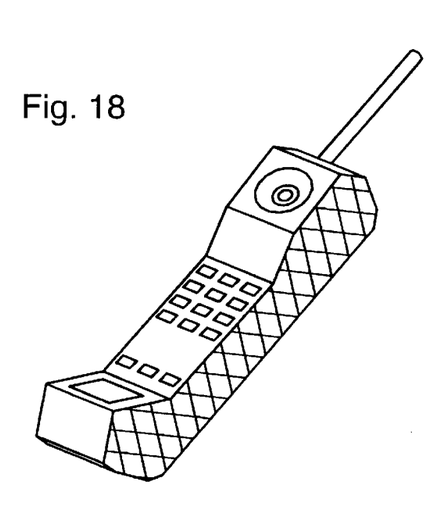
FIG. 18 illustrates a cellular telephone which has been at least partially coated with a vanadium tetracyanoethylene solvent complex.

FIG. 6 illustrates the permeability, u, of the V/TCNE complex derived from V(CO)$_6$ over the temperature range from 5 K to 300 K. It can be readily seen that this material maintains surprisingly increasing permeability over this temperature range and is expected to maximize in permeability above room temperature.

SYNTHESIS

Samples of V(TCNE)$_x$(solvent)$_y$ were prepared under inert atmosphere by adding a solution of V(C$_6$H$_6$)$_2$ in solvent X dropwise to a solution of TCNE in solvent Y, resulting in a black powder precipitate. The mixing of the solvent solutions can be at room temperature and after the formation of the precipitate the excess solvent was removed by vacuum filtration or evaporation. The solvents used included X=Y=CH$_2$Cl$_2$; X=C$_6$H$_6$, Y=CH$_3$CN; and X=Y=CH$_3$CN. In this manner were prepared V(TCNE)$_x$(CH$_2$Cl$_2$)$_y$, V(TCNE)$_x$(CH$_3$CN/C$_6$H$_6$)$_y$, and V(TCNE)$_x$(CH$_3$CN)$_y$. Infrared spectra showed an absence of C$_6$H$_6$ in the precipitate.

Using the same procedure, a different vanadium source, V(CO)$_6$, was put into the dichloromethane solution and combined with the TCNE. The resulting vanadium TCNE solvent complex was of similar composition, i.e., V(TCNE)$_x$(CH$_2$Cl$_2$)$_y$, however, the local order within the microstructure of the complex was believed to be different from that of the complex derived from V(C$_6$H$_6$)$_2$. This increased local order was manifest in the significantly different permeability value, u, shown in FIGS. 1 and 6. It is believed, but the inventors do not wish to be limited to the theory that, the use of V(CO)$_6$ produced increased order within the microstructure about the vanadium, which in turn provides reduced defects in the material and improved permeability, shielding and core properties.

Solvents useful in the present invention for the preparation of vanadium TCNE complexes for use in static and time dependent shielding and core properties can include but are not limited to 1,2-dichloroethane, benzene, diethyl ether, toluene, dichloromethane, acetonitrile, tetrahydrofuran, mixtures thereof and the like. Where a mixed solvent system is used, such as $CH_3CN/C_6H_6$, a preferred ratio is 1/1, however this ratio is not a limitation herein and the ratio can range from about 1/99 to 99/1. Ternary and even more complex solvent systems are also useful in preparing the V(TCNE) complexes of the present invention. The solvent system can be mixed in proportions designed to facilitate preferred fabrication parameters, evaporation points, and solubility. The use of solvents in the present invention allows the tailoring of the solvent complex to achieve the desired level of order or disorder in the microstructure of the complex. Increased order in the complexes of the present invention produces reduced defects, increased permeability and increased shielding. The permeability, shielding and core properties can also be improved through controlling local disorder. Disorder can be created or tailored for specific applications in the present invention by selection of the solvent or solvents, or by the introduction of one or more transition metals. Thus, for example, up to about 10% by weight of one or more transition metals, including titanium, cobalt, iron, or nickel, or a solvent or solvents can be added to the vanadium tetracyanoethylene complex, whereby the local disorder can be used to tailor the permeability, shielding and core properties. Other substances useful herein to control disorder within the microstructure can include aluminum, magnesium, scandium, carbon, manganese, chromium, copper, zinc, gallium, yttrium, zirconium, niobium, molybdenum, palladium, tin, silver, platinum, gold, lead, silicon, germanium or mixtures thereof.

A third method of controlling disorder within the microstructure of the V(TCNE) complex is by the substitution of up to about 10% of the TCNE units with an organic acceptor, such as tetracyanoquinodimethane (TCNQ), dicyanodichloroquinone (DDQ), hexacyanobutadiene ($C_4(CN)_6$), and one or more halogens, or mixtures of the above.

The preferred ratio of x and y in the $V(TCNE)_x(solvent)_y$ complex can range from about x=1.0 to about 2.5, and y=0, or the minimum necessary for dissolution, suspension or mixing, to about 2.0 A more preferred ratio is x=2 and y=0.5

MEASUREMENTS

The ac permeability of each vanadium-organic complex of the present invention was measured using the mutual inductance technique for 10 Hz to $10^4$ Hz. Two secondary coils of 1050 turns of 30 gauge copper magnet wire and 2 cm long were counter-wound coaxially, separated by 1 cm, on a 2 cm diameter phenolic form. A primary coil of 1400 turns and 3 cm diameter was wound with length 10 cm, extending 2.5 cm beyond the edge of each secondary, giving an ideal field variation of <3% over the length of each secondary coil. The coil setup was mounted in an Oxford Instruments ESR 910 continuous flow He cryostat, and temperature control was via an Oxford ITC-4 temperature controller. The coil was immersed in a liquid nitrogen bath to eliminate temperature variation of the coil's complex impedance. This nitrogen bath and coil insert were shielded from external magnetic fields with a 40 mil-thick cylindrical shell of mumetal. An oscillating field was created by driving the primary coil in series with a large resistance from the oscillator in a Stanford Research SR 530 lock-in amplifier, which was then used to measure the voltage and phase of the secondary coil. The system was calibrated with a niobium cylinder. The results presented in FIG. 1 were measured on powder samples at 400 Hz with an exciting field of 220 mOe. For $V(TCNE)_x(CH_2Cl_2)_y$ and $V(TCNE)_x(CH_3CN/C_6H_6)_y$, the permeability was measured by cooling to 2.0 K and stabilizing at each temperature before the ac permeability measurement. The ac permeability of $V(TCNE)_x(CH_3CN)_y$ was measured as the samples cooled from 30 K to 5 K at a rate of 0.5K/minute, and then held at 5 K for two minutes before sweeping up to 150 K at the same rate.

This inductive permeability measurement technique for determining shielding is a demonstration of the inductive and transformer embodiment of the present invention described further below.

Permeability between $10^4$ and $10^5$ Hz was measured by placing the sample within the coil of an inductor-resistor network and measuring the change in inductance. Electronic and temperature controls were similar to the lower frequency mutual inductance technique. Higher frequency measurements were made using an HP8350B Sweep Oscillator.

The dc magnetic hysteresis was measured at 50 K and 100 K with a Quantum Design MPMS SQUID magnetometer by cooling in zero field from 150 K to the measurement temperature, and then measuring the magnetization as the field was ramped up to 100 Oe, down to −100 Oe, and then back up to 100 Oe (at −0.33 Oe/s). Hysteresis measurements on the powdered samples were symmetric in the first and third quadrants; only a half hysteresis loop is shown in FIGS. 2 and 5. The density of about 1.0 g/cm3 for both $V(TCNE)_x(CH_2Cl_2)_y$ and $V(TCNE)_x(CH_3CN)_y$ was determined by pressing a pellet (1.3) cm in diameter) and then measuring the dimensions and mass. These densities are shown in FIG. 4.

The ordering temperature, $T_c$, is above 350 K for $V(TCNE)_x(CH_2Cl_2)_y$, (its decomposition temperature), 130–140 K for $V(TCNE)_x(CH_3CN/C_6H_6)_y$, and 80–120 K for $V(TCNE)_x(CH_3CN)_y$ from both ac permeability and dc magnetization measurements. Frequency dependent ac permeability indicates that the initial permeabilities for $V(TCNE)_x(solvent)_y$ complexes are independent of frequency from dc to 100 kHz, except near the spin glass freezing temperature, $T_f$, in $V(TCNE)_x(CH_3CN/C_6H_6)_y$, and $V(TCNE)_x(CH_3CN)_y$, where strong frequency dependence was seen. Microwave experiments at 6 GHz showed small (about 1) initial permeability for $V(TCNE)_x(CH_2Cl_2)_y$ and $V(TCNE)_x(CH_3CN/C_6H_6)_y$ at all temperatures in this frequency range.

The half hysteresis loops for the materials of the present invention show low energy loss for $V(TCNE)_x(CH_3CN)_y$ of two erg/(cm$^3$ cycle) at 50 K and 0.1 erg/(cm$^3$ cycle) at 100 K. This compares favorably with the losses for the prior art materials presented in FIG. 4.

The lower end of the useful range for magnetic field shielding is dc, such as would be used in mine sweeping applications and other static fields. Another frequency range which can be blocked or absorbed by the materials herein is from dc to $10^3$ Hz which includes power and household applications. The frequency range of $10^3$ to $10^5$ Hz can be blocked by the present materials to thereby include audio waves. Radio and TV waves in the frequency range of $10^5$ to 107 Hz can also be blocked by the materials of the present invention. The upper end of the useful range for field shielding is greater than 100 kHz, and as high as $10^9$ Hz. However, at 6.5 GHz ineffective shielding results were obtained for dichloromethane complexes. The upper frequency limit is a function of the local order and purity of the shielding or core material, but can be as high as $10^7$ to $6 \times 10^9$ Hz, which includes radar waves, satellite communications, and microwaves.

The materials of the present invention exhibit permeability per mass density values which are in some instances as good as or better than iron, as shown in FIG. 4, under the column (mu/rho) u/p, and represented in FIG. 3. Thus, light weight shielding articles and coatings can be produced from the present invention. 16

Another important feature of the materials of the present invention is that the vanadium TCNE complexes can be made at room temperature, which is an important advantage over the energy intensive preparation of iron and ferrite materials.

In another feature of the present invention, the vanadium tetracyanoethylene complexes can be blended, mixed or co-dissolved with another material to thereby combine the benefits of the two materials. Thus, in addition to the alternate organic acceptors such as TCNQ and DDQ described above, blends of the $V(TCNE)_x(solvent)_y$ complex with KBr and also with Nujol are prepared whereby infrared spectra could be obtained. In a similar manner, the $V(TCNE)_x(solvent)_y$ complex can be mixed or blended with, for example, a secondary material such as nylon, teflon, polyvinyl chloride, polyesters, epoxies, silicones or other plastic materials or other organic or inorganic materials. The $V(TCNE)_x(solvent)_y$ complex can be dry blended in the powder form with another material or dissolved or suspended in a solvent or other diluent or carrier and sprayed, brushed, co-deposited, pressed, or fabricated into useful coatings or devices. In this manner, the mechanical strength or other spectral or physical property of the secondary material can be combined with the magnetic shielding and inductive properties of the $V(TCNE)_x(solvent)_y$ complex.

The $V(TCNE)_x(solvent)_y$ complex, or a blend of the $V(TCNE)_x(solvent)_y$ complex with another material, can be used to coat, impregnate, laminate or otherwise treat a flexible substrate such as a cloth or plastic fabric, web, net, or sheet, or a solid, inflexible substrate, such as a plastic or metallic object. The $V(TCNE)_x(solvent)_y$ complex, or a blend comprising same, can be applied to, or encapsulated within, for example, aluminum sheet or fiber, cloth, cellulosics, plastics, titania, silica or fiberglass. Other metallic solids, fibers or powders which can be blended with, encapsulated by, or used to encapsulate the V(TCNE) include scandium, carbon, titanium, iron, manganese, magnesium, cobalt, chromium, copper, zinc, gallium, yttrium, zirconium, niobium, molybdenum, palladium, tin, silver, platinum, gold, lead, silicon, germanium or nickel or mixtures thereof, such as stainless steel and the like.

The materials of the present invention are particularly well suited for shielding low frequency electromagnetic fields, such as but not limited to, a static magnetic field. Thus, one use for the materials of the present invention could include coating a vessel for anti-metal detection. In this manner an airplane, satellite, boat or ship's hull could be coated or otherwise treated with a vanadium tetracyanoethylene solvent complex of the present invention, whereby the complex would deflect, block or otherwise interfere with magnetic fields to prevent detection. Other uses of low frequency electromagnetic field shielding obtainable from the present invention include shielding of unwanted fields generated by consumer and commercial electrical and electronic equipment including but not limited to electric blankets, household wiring, cellular telephones, and high tension wires, all of which have created concerns with regard to exposure of the public to electromagnetic fields.

In addition, the present invention can be used to shield magnetic imaging equipment, nuclear magnetic resonance equipment, computer disks and computer disk drives, and any magnetic or electromagnetic devices, machines, and equipment.

Another use of the present invention is to shield rooms and buildings in which electronic data are generated, used, stored, transmitted or received. In this manner the electronic instruments and data in the rooms and buildings can be protected from jamming devices or signals, stray signals, and accidental or deliberate erasures from outside the room or building. In a similar manner, magnetic fields generated within a room or building coated with a vanadium tetracyanoethylene solvent complex will be retained within the room or building.

Another use of the materials of the present invention is for inductive applications, which also desire high permeability, low conductivity and low hysteresis loss just as field shielding applications require. Prior art materials for inductive applications have included transition metal alloys which have high permeability, but also have high eddy current loss and fairly large inductive loss. In addition, the prior art transition metals suffer from excessive weight for many applications. Also, ferrite materials have high permeability and resistivity and no eddy current loss, but also exhibit high hysteresis losses. Therefore, a need exists for a material for inductive applications, such as but not limited to, power transformers and light weight motors based on V(TCNE) solvent complexes.

Transformers generally take a signal from one coil and transmit the signal to another coil by means of a magnetic high permeability material. The signal in the first coil changes with time and will thereby induce a change in the second coil through the magnetic material. Desirable features for materials useful as transformer core materials would include high permeability, low coercive field, and low weight, i.e., low density. These features are provided by the vanadium organic complexes described herein.

Thus, the present invention provides a material for cores for transformers, motors and the like comprising a low density composition selected from the group consisting of $V(TCNE)_x(CH_3CN/C_6H_6)_y$, $V(TCNE)_x(CH_3CN)_y$, $V(TCNE)_x(C_4H_8O)_y$ and $V(TCNE)_x(CH_2Cl_2)_y$. In this manner, a motor or the like can be produced in which the core comprises a $V(TCNE)_x(solvent)_y$ complex, whereby the motor is significantly lighter in weight than is a motor produced from a conventional metal alloy core material.

The inductive embodiment of the invention is exemplified in the permeability measurement tests described hereinabove for measuring shielding. In that use, inductive and transformer embodiments utilizing the V(TCNE) complex are demonstrated using a mutual inductance of two transformers connected in series to cancel the air core properties and measure the V(TCNE) complex core properties.

As discussed hereinabove for shielding applications, the V(TCNE) solvent complexes can be modified, blended with, and applied to other materials to thereby combine or alter desirable inductive and transformer core properties. Such modified or unmodified V(TCNE) materials can be fabricated into useful devices and components by conventional processing. In this manner, novel power transformer devices, light weight motors and other inductive applications are provided.

While certain preferred embodiments of the present invention have been disclosed in detail, it is to be understood that various modifications may be adopted without departing from the spirit of the invention or scope of the following claims.

We claim:

1. An electromagnetic field shield comprising a vanadium tetracyanoethylene solvent complex, wherein the electromagnetic field is in the frequency range of from direct current to $6 \times 10^9$ Hz, and wherein the complex has been applied to an object to be shielded from the field.

2. The shield of claim 1 wherein the solvent which is complexed with the vanadium tetracyanoethylene is dichloromethane.

3. The shield of claim 1 wherein the solvent which is complexed with the vanadium tetracyanoethylene is $CH_3CN$.

4. The shield of claim 1 wherein the solvent which is complexed with the vanadium tetracyanoethylene is a mixture of $CH_3CN$ and benzene.

5. The shield of claim 1 wherein the solvent which is complexed with the vanadium tetracyanoethylene is selected from the group consisting of 1,2-dichloroethane, benzene, diethyl ether, toluene, dichloromethane, acetonitrile, tetrahydrofuran, and mixtures thereof.

6. The shield of claim 1 wherein the complex has a composition of the formula $V(TCNE)_x(CH_2Cl_2)_y$.

7. The shield of claim 1 wherein the complex has a composition of the formula $V(TCNE)_x(CH_3CN/C_6H_6)_y$.

8. The shield of claim 1 wherein the complex has a composition of the formula $V(TCNE)_x(CH_3CN)_y$.

9. The shield of claim 1 wherein the complex has a composition of the formula $V(TCNE)_x(C_4H_8O)_y$.

10. The shield of claim 1 wherein the complex has a density of from 0.8 to 1.5 $g/cm^3$.

11. The electromagnetic field shield of claim 1 wherein the solvent complex is blended with a secondary material.

12. The electromagnetic field shield of claim 11 wherein the secondary material is selected from the group consisting of cellulosics, plastics, silica, fiberglass, and titania.

13. The electromagnetic field shield of claim 11 wherein the secondary material is selected from the group consisting of aluminum, scandium, carbon, titanium, iron, magnesium, manganese, cobalt, chromium, copper, zinc, gallium, yttrium, zirconium, niobium, molybdenum, palladium, tin, silver, platinum, gold, lead, silicon, germanium, nickel and mixtures thereof.

* * * * *